United States Patent [19]

Routh et al.

[11] 4,156,309

[45] May 29, 1979

[54] METHOD OF CONSTRUCTION OF A MULTI-CELL SOLAR ARRAY

[75] Inventors: Donald E. Routh; Ben R. Hollis; William R. Feltner, all of Huntsville, Ala.

[73] Assignee: The United States of America as represented by the Administrator of the National Aeronautics and Space Administration, Washington, D.C.

[21] Appl. No.: 863,773

[22] Filed: Dec. 23, 1977

[51] Int. Cl.² ............................................. B01J 17/00
[52] U.S. Cl. ................................ 29/572; 29/577 C; 29/578; 29/580; 357/45
[58] Field of Search ................ 29/572, 573, 577, 578, 29/580; 357/45

[56] References Cited

U.S. PATENT DOCUMENTS

| 3,471,923 | 10/1969 | Lamorte | 29/573 |
| 3,912,556 | 10/1975 | Grenon | 29/572 |
| 3,999,205 | 12/1976 | Stewart | 357/45 |
| 4,045,245 | 8/1977 | Coleman | 29/572 |

Primary Examiner—W. Topman
Attorney, Agent, or Firm—George J. Porter; John R. Manning; L. D. Wofford, Jr.

[57] ABSTRACT

The method of constructing a high voltage, low power, multi-cell solar array wherein a solar cell base region is formed in a substrate such as but not limited to that of silicon or on a substrate of sapphire, and then by the steps of application of a protective coating on the base, patterned etching of the coating and base to thereby form discrete base regions, forming a semi-conductive junction and upper active region in each base region defined by photolithography, and thus forming discrete cells which are interconnected by metallic electrodes.

5 Claims, 8 Drawing Figures

METHOD OF CONSTRUCTION OF A MULTI-CELL SOLAR ARRAY

ORIGIN OF THE INVENTION

The invention described herein was made by employees of the United States Government, and may be manufactured and used by or for the Government of the United States for governmental purposes without the payment of any royalties thereon or therefor.

BACKGROUND OF THE INVENTION

1. Field of the Invention

This invention relates to the method of construction of photovoltaic devices, and particularly to a method of construction of multi-cell photovoltaic devices, or solar arrays as they are commonly referred to.

2. General Description of the Prior Art

Heretofore, the usual method of obtaining higher than single cell voltages from solar arrays has been first to construct physically separate solar cells and then to simply wire them together. Alternately, it has been proposed that multi-cell solar arrays be constructed on a single insulating substrate and, by a method which includes the initial deposition of electrical connections on the substrate, form successive, opposite polarity, or doped, states, semi-conductive layers.

The interconnection of individual solar cells typically requires a skilled technician which is both time consuming and expensive, and the interconnections are typically not as reliable as the individual cells, and thus maximum utilization of the cells is not obtained.

A problem to be anticipated with the construction of proposed devices utilizing an insulating substrate is that of low light-to-electrical energy conversion efficiency.

It is an object of this invention to provide a method of manufacture which overcomes the aforesaid difficulties.

SUMMARY OF THE INVENTION

In accordance with this invention, the first step is to effect on a substrate of silicon or sapphire a semi-conductive layer with an appropriate impurity concentration to effect a semi-conductive base region. Alternately, the substrate may be of a different material, provided the crystal lattice structure is substantially similar to that of this layer. Next, by photolithography, the base region is divided into a plurality of base regions, and as separated, upper active surface regions are created in the base regions by diffusion of an impurity of opposite polarity to that employed in the creation of base regions. By photolithography and etching, metal contacts are formed which interconnect between the upper active region of one cell and the lower base region of the adjoining cell. In this manner, the cells are so connected in series as to make their voltages additive.

DETAILED DESCRIPTION OF THE DRAWINGS

Figure 1:
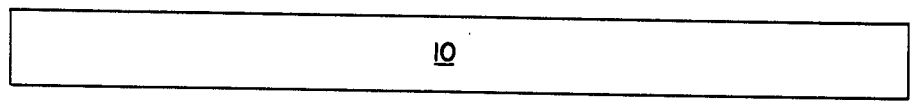
FIGS. 1–8 illustrate the progressive steps in the formation of a solar array as contemplated by this invention.

Referring to FIG. 1, a wafer of microelectronic grade silicon or sapphire is cleaned and employed to form a substrate 10. Where silicon is used, the silicon should have a high resistivity, that is, a resistivity of 100 ohms cm or greater.

Figure 2:
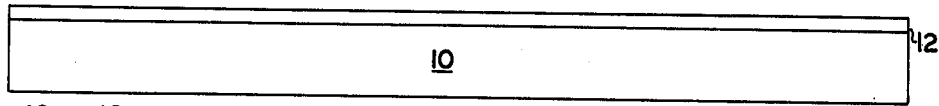

Next, as shown in FIG. 2, a semi-conductive base region 12 is formed by the diffusion of an impurity concentration of approximately $10^{17}$ atoms/cm$^3$ into a silicon substrate wherein the impurity type is opposite to the impurity type of the substrate. Diffusion is to a depth of 7 to 10 micrometers. In the case of a sapphire substrate, an epitaxy layer of silicon is deposited to a thickness of 7 to 10 micrometers on the substrate, having an impurity concentration of approximately $10^{17}$ atoms/cm$^3$ in this layer.

Figure 3:
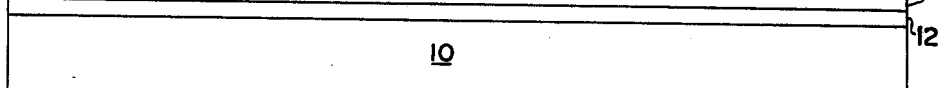

Next, and with reference to FIG. 3, there is grown or deposited a protective dielectric layer 14, being of a material such as silicon dioxide. The layer would be effected to an approximate depth or thickness of 300 micrometers. On it there is applied a layer of photo resist, and by photolithography, a pattern of photo resist 16 is formed to define solar cell locations 18a–18d separated by exposed boundary regions 20.

Figure 4:
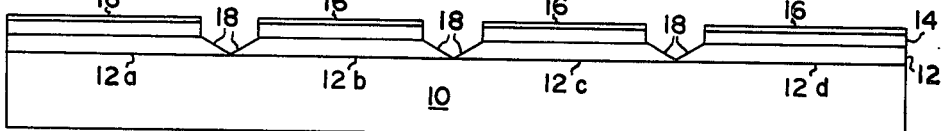

Next, as shown in FIG. 4, exposed protective dielectric layer 14 in the boundary regions is etched away by using a dielectric etch such as a room temperature buffer etch H$_2$O:HF:NH$_4$F to etch silicon dioxide. After this, the photo resist 16 in solar cell locations 18a–18d is removed. Next, the exposed areas of base 12 are etched away using a preferential silicon etch such as H$_2$O:KOH. This etch subdivides base region 12 into isolated solar cell base regions 12a, 12b, 12c, and 13d and also slopes walls 18 to the base regions for good metallic coverage as shown in FIG. 8.

Figure 5:
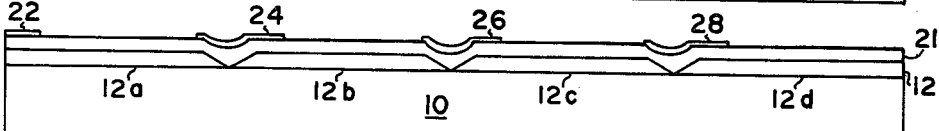

Next, as shown in FIG. 5, a second protective dielectric coating is grown over the entire wafer to a depth of 300 micrometers. On top of it, photo resist is applied and processed to leave a pattern of photo resist cover regions 22, 24, 26, and 28. Between these regions, portions of protective dielectric cover 21, not covered by the photo resist, are etched away (FIG. 6) by a dielectric etch. The photo resist covering regions 22, 24, 26, and 28 is dissolved and removed. In the etched regions, regions 30a–30d solar cell junctions are created by diffusing into the now isolated bases 12a–12d an opposite polarity type impurity (to that initially used in creating base 12), diffusion being to a depth of 0.25 to 0.5 micrometers and of a concentration of approximately $10^{20}$ atoms/cm$^3$. In this way, discrete solar cells 31a–31d are formed, having upper active surfaces 32a–32d.

Figure 6:
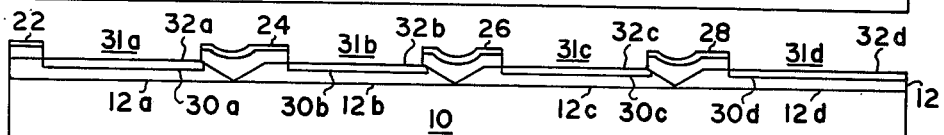
Figure 7:
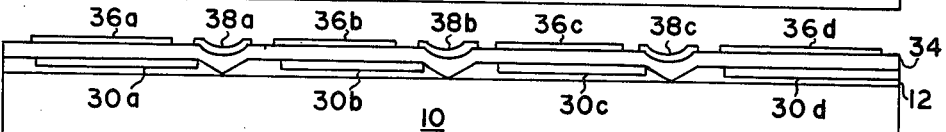

Next, as illustrated in FIG. 6, the remaining portion of protective dielectric coating 21 is etched away with dielectric etch. After this, as shown in FIG. 7, a new protective dielectric coating 34 is formed over the entire surface, which coating would be of a thickness of 100 to 300 micrometers and embodying an outer surface of blue or purple to serve as an anti-reflection coating for solar cells 31a–31d. Assuming that the protective dielectric coating shown does not provide the anti-reflective feature, then at this point a separate anti-reflection material should be added to the upper surface of solar cells 31a–31d.

Figure 8:
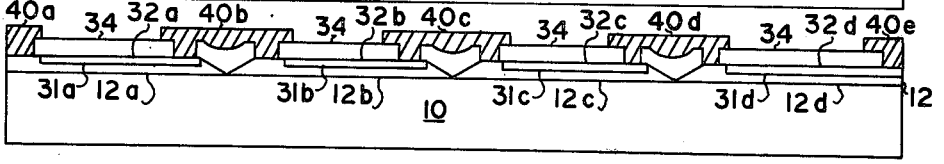

Next, and with reference to FIG. 7, cell cover photo resist regions 36a–36d and electrode cover photo resist regions 38a–38c are formed on the surface of protective dielectric coating 34, and thereafter that portion not covered by the photo resist is etched away, enabling, as shown in FIG. 8, electrodes 40a–40e to be formed. As a means of forming electrodes, a metallic coating, such as aluminum, is applied over the entire surface of the device and then covered by photo resist which is processed to protect desired electrode areas. The balance of unprotected metallic coating is then etched away and finally the photo resist dissolved and removed.

Electrode 40a connects to base 12a of solar cell 31a, and electrode 40b connects between active region 32a of that solar cell and base 12b of solar cell 31b. Electrode 40c similarly connects between the active region of solar cell 31b and base 12c of solar cell 31c. Electrode 40d connects between active region 32c of solar cell 31c and base 12d of solar cell 31d. Electrode 40e connects to the active region of solar cell 31d and it, together with electrode 40a, provides output terminals across which the full series voltage of the solar cells is obtained.

It is to be appreciated that by the method described, a solar array may be created which is monolithic and which thereby eliminates the need to individually connect cells. By forming the solar cells by diffusion into a substrate of silicon, or applying an epitaxy layer of silicon over an insulating substrate, and therefrom forming a semi-conductor junction, the efficiency of standard discrete solar cells is retained.

Having thus described our invention, what is claimed is:

1. The method of making a multi-cell solar array comprising:
    forming on a substrate a first layer of semi-conductive material of a first conductivity type, said substrate being of a material which has a crystal lattice structure substantially similar to that of said layer;
    forming a protective dielectric coating over said layer of semi-conductive material;
    removing, along boundary paths, said protective dielectric coating and semi-conductive material, and thereby separating discrete sections of said semi-conductive material;
    removing the balance of said protective dielectric coating and forming in central top regions of said sections a second semi-conductive layer of smaller top surface than said first layer and of opposite polarity to that of said first layer, whereby a semi-conductive junction is formed between layers;
    forming a protective insulative coating over a portion of the top surface of each said second layer of each section which extends on one side to cover an edge portion of said first layer of that section and leaves uncoated an opposite edge portion of the first layer of that section; and
    forming electrical connections between adjoining said sections, connection being between an uncoated portion of a first layer of one section and an uncoated portion of a second layer of an adjoining said section, said uncoated portions being those left uncoated from the preceding step.

2. The method as set forth in claim 1 wherein said step of removing along boundary paths comprises:
    the forming of a photo resist over said first layer other than over desired said boundary paths;
    etching away said protective dielectric coating and said first layer of said semi-conductive material in regions corresponding to said boundary paths; and
    removing said photo resist.

3. The method as set forth in claim 2 wherein said material is silicon containing an impurity providing a second conductivity type, and said material having a resistivity of at least 100 ohms. cm.

4. The method as set forth in claim 2 wherein said substrate is of sapphire, and said first layer is formed by applying to said substrate an epitaxy layer of silicon to a thickness of 7 to 10 micrometers, and said first layer having an impurity concentration of approximately $10^{17}$ atoms/cm$^3$.

5. The method as set forth in claim 2 wherein said removal of protective dielectric along said boundary paths is by a dielectric etch, and the removal of said first layer in said boundary paths is etched by a preferential silicon etch.

* * * * *